(12) United States Patent
Yagi et al.

(10) Patent No.: US 10,504,690 B2
(45) Date of Patent: Dec. 10, 2019

(54) SAMPLE HOLDER AND ELECTRON MICROSCOPE

(71) Applicant: JEOL Ltd., Tokyo (JP)

(72) Inventors: Kazuki Yagi, Tokyo (JP); Takeo Sasaki, Tokyo (JP); Ichiro Onishi, Tokyo (JP); Shuichi Yuasa, Tokyo (JP); Masashi Shimizu, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/007,276

(22) Filed: Jun. 13, 2018

(65) Prior Publication Data

US 2018/0374671 A1 Dec. 27, 2018

(30) Foreign Application Priority Data

Jun. 23, 2017 (JP) .................. 2017-123484

(51) Int. Cl.
*H01J 37/20* (2006.01)
*H01J 37/10* (2006.01)
*H01J 37/244* (2006.01)
*H01J 37/09* (2006.01)
*H01J 37/28* (2006.01)
*H01J 37/30* (2006.01)

(52) U.S. Cl.
CPC ............. *H01J 37/20* (2013.01); *H01J 37/09* (2013.01); *H01J 37/10* (2013.01); *H01J 37/244* (2013.01); *H01J 37/28* (2013.01); *H01J 37/30* (2013.01); *H01J 2237/2445* (2013.01); *H01J 2237/2802* (2013.01); *H01J 2237/2809* (2013.01); *H01J 2237/31749* (2013.01)

(58) Field of Classification Search
CPC .. H01J 37/00; H01J 37/02; H01J 37/20; H01J 37/26; H01J 37/261; H01J 37/32715
USPC ................................ 250/306, 307, 310, 311
See application file for complete search history.

(56) References Cited

U.S. PATENT DOCUMENTS

2003/0089852 A1* 5/2003 Ochiai ................. H01J 37/256
250/310
2010/0148064 A1* 6/2010 Harrach ............... H01J 37/244
250/307

FOREIGN PATENT DOCUMENTS

JP         201672005 A      5/2016

* cited by examiner

*Primary Examiner* — Jason L McCormack
(74) *Attorney, Agent, or Firm* — The Webb Law Firm

(57) ABSTRACT

A sample holder capable of limiting X-rays accepted into an X-ray detector is provided. The sample holder is for use in an electron microscope equipped with a polepiece assembly and a semiconductor detector. The sample holder includes: a sample stage on which a sample is held; and a shield plate. When the sample stage has been introduced in the sample chamber of the electron microscope, the shield plate is located between the polepiece assembly and the semiconductor detector.

6 Claims, 13 Drawing Sheets

SAMPLE HOLDER AND ELECTRON MICROSCOPE

CROSS-REFERENCE TO RELATED APPLICATION

This application claims priority to Japanese Patent Application No. 2017-123484 filed Jun. 23, 2017, the disclosure of which is hereby incorporated in its entirety by reference.

BACKGROUND OF THE INVENTION

Field of the Invention
The present invention relates to a sample holder and an electron microscope.
Description of Related Art
An energy dispersive X-ray spectrometer (EDS spectrometer or simply EDS) is known as an elemental analyzer equipped in a scanning electron microscope (SEM) or in a transmission electron microscope (TEM).
An EDS has a semiconductor detector. When X-rays generated from a sample are detected, the semiconductor detector (X-ray detector) is disposed near the sample (see, for example, JP-A-2016-72005).
FIG. 13 schematically illustrates the manner in which an EDS analysis is being conducted in a transmission electron microscope. When a sample S held to a sample holder 1100 is illuminated with an electron beam EB, Bremsstrahlung occurs in the sample S. That is, electrons undergo acceleration from electric fields of atomic nuclei within the sample to thereby radiate electromagnetic waves (X-rays). If X-rays produced by Bremsstrahlung are reflected by a bottom polepiece 1013 and accepted into a semiconductor detector 1022, then the background of the resulting spectrum will increase.
If the electron beam EB impinges on the sample S, the electrons are scattered within the sample S, thus producing scattered electrons. The scattered electrons collide against the bottom polepiece 1013, generating characteristic X-rays from the bottom polepiece 1013. If characteristic X-rays emanating from other than the sample S are accepted into the semiconductor detector 1022, peaks of elements originating from other than the sample appear in the spectrum.
In EDS, in order to detect trace elements unambiguously, it is important to reduce the background. For this purpose, acceptance of unwanted X-rays such as caused by Bremsstrahlung and X-rays emanating from other than the sample into the semiconductor detector must be limited.

SUMMARY OF THE INVENTION

The present invention has been made in view of the foregoing problem. One object associated with some aspects of the present invention is to provide a sample holder capable of restricting unwanted X-rays impinging on an X-ray detector. Another object associated with some aspects of the present invention is to provide an electron microscope including this sample holder.
A sample holder associated with the present invention is for use in or with an electron microscope equipped with a polepiece assembly and an X-ray detector and includes: a sample stage on which a sample is held; and a shield plate positioned between the polepiece assembly and the X-ray detector when the sample stage has been introduced in a sample chamber of the electron microscope.
With this sample holder, X-rays produced within the sample by Bremsstrahlung and reflected by the polepiece assembly and X-rays induced by collisions of scattered electrons against the polepiece assembly can be shielded by the shield plate. Consequently, in this sample holder, unwanted X-rays impinging on the X-ray detector can be limited.
An electron microscope associated with the present invention includes a sample holder associated with the present invention.
In this electron microscope, acceptance of unwanted X-rays into the X-ray detector can be limited. Therefore, in this electron microscope, the background of the resulting spectrum can be reduced without major modifications to the instrument.

DESCRIPTION OF THE INVENTION

Figure 1:
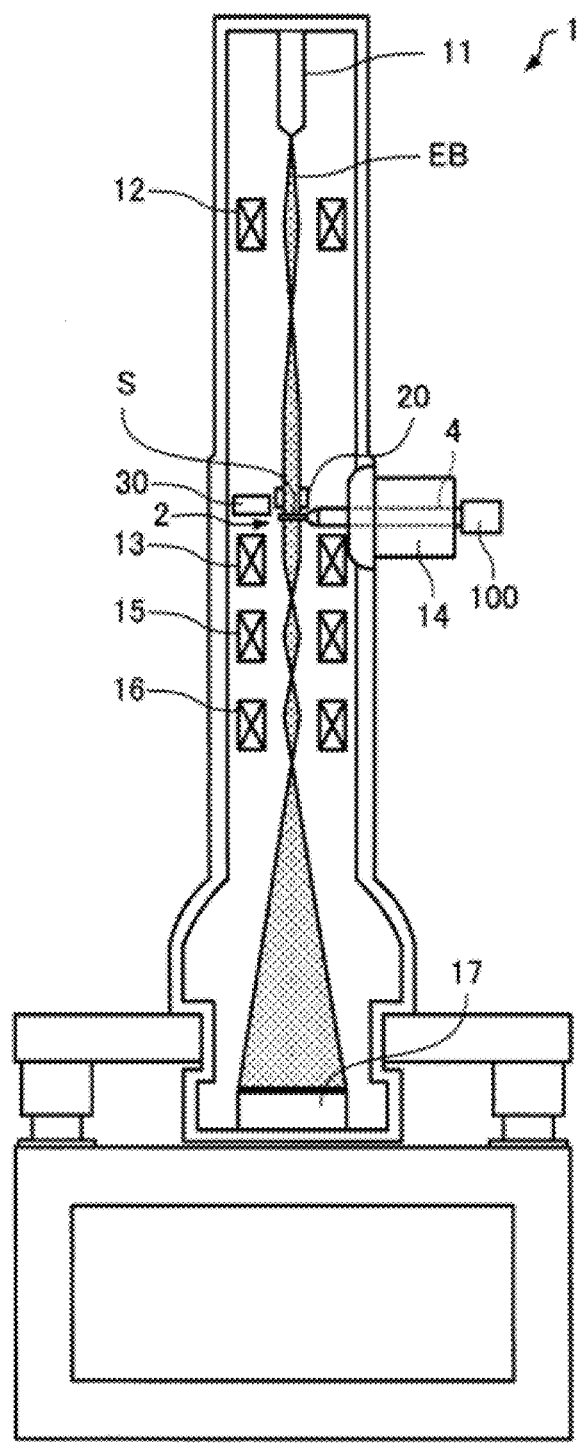
FIG. 1 is a vertical cross section of an electron microscope including a sample holder associated with a first embodiment of the present invention.

Embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.
1. First Embodiment
A sample holder associated with a first embodiment of the present invention is first described by referring to FIG. 1, which shows the configuration of an electron microscope 1 including the sample holder, 100, associated with the first embodiment. FIG. 1 shows a state in which a sample S has been introduced into a sample chamber 2 by the sample holder 100.

The electron microscope 1 is a transmission electron microscope (TEM), for example. The electron microscope 1 includes the sample holder 100 associated with the present embodiment.

The electron microscope 1 further includes an electron source 11, a condenser lens system 12, an objective lens 13, a sample positioning device 14, an intermediate lens 15, a projector lens 16, an imager 17, and energy-dispersive X-ray spectrometers (may also be referred to as EDS spectrometers) 20, 30.

The electron source 11 produces an electron beam EB. The electron source 11 is an electron gun that emits the electron beam EB by accelerating electrons, released from a cathode, by means of an anode.

The condenser lens system 12 operates such that the electron beam EB produced from the electron source 11 is focused onto the sample S. The condenser lens system 12 may be configured including a plurality of lenses (not shown).

The objective lens 13 is located behind the condenser lens system 12. The objective lens 13 is an initial stage of lens for imaging the electron beam EB transmitted through the sample S. The objective lens 13 has a polepiece assembly including top and bottom polepieces (not shown) for producing a magnetic field therebetween to focus the electron beam EB.

The sample holder 100 is mounted on the sample positioning device (sample stage) 14. The sample positioning device 14 has a cylindrical sample holder mounting member including a sample holder mounting hole into which the sample holder 100 is inserted. The sample positioning device 14 places the sample S, which is held by the sample holder 100, between the top and bottom polepieces.

The sample positioning device 14 places the sample S in position, the sample S being held by the sample holder 100 in the sample chamber 2. The sample positioning device 14 is capable of moving and stopping the sample holder 100. The sample positioning device 14 can move the sample S in a horizontal direction perpendicular to the direction of travel of the electron beam EB and in a vertical direction along the direction of travel of the electron beam EB. Furthermore, the sample positioning device 14 can tilt the sample S. The sample positioning device 14 constitutes a side-entry type stage for inserting the sample holder 100 (and thus the sample S) from a side of the polepiece assembly.

The intermediate lens 15 and projector lens 16 together operate to further magnify the image focused by the objective lens 13 and to bring the magnified image into focus on the imager 17. In the electron microscope 1, the objective lens 13, intermediate lens 15, and projector lens 16 together constitute an imaging system.

The imager 17 captures a transmission electron microscope (TEM) image focused by the imaging system. The imager 17 is a digital camera such as a CCD (charge-coupled device) camera or a CMOS (complementary MOS) camera.

The EDS spectrometers 20 and 30 detect characteristic X-rays which are produced from the sample S in response to impingement of the electron beam EB. Each of the EDS spectrometers 20 and 30 has a semiconductor detector that is one example of X-ray detector. For example, a silicon drift detector (SDD), a Si (Li) detector, or the like can be used as the semiconductor detector.

If X-rays are accepted into the semiconductor detector, electric charge corresponding to the magnitude of the energy of the X-ray is produced in the detector. The charge is converted into a voltage variation by field-effect transistors. The output signal (output pulses) from the semiconductor detector is sent to a multichannel analyzer (MCA) (not shown), which is a pulse height analyzer having a plurality of channels and counts the output signal (output pulses) from the semiconductor detector for each X-ray energy level. An EDS spectrum having a horizontal axis on which X-ray energy is plotted and a vertical axis on which X-ray counts are plotted can be generated from the results of the counting.

Figure 2:
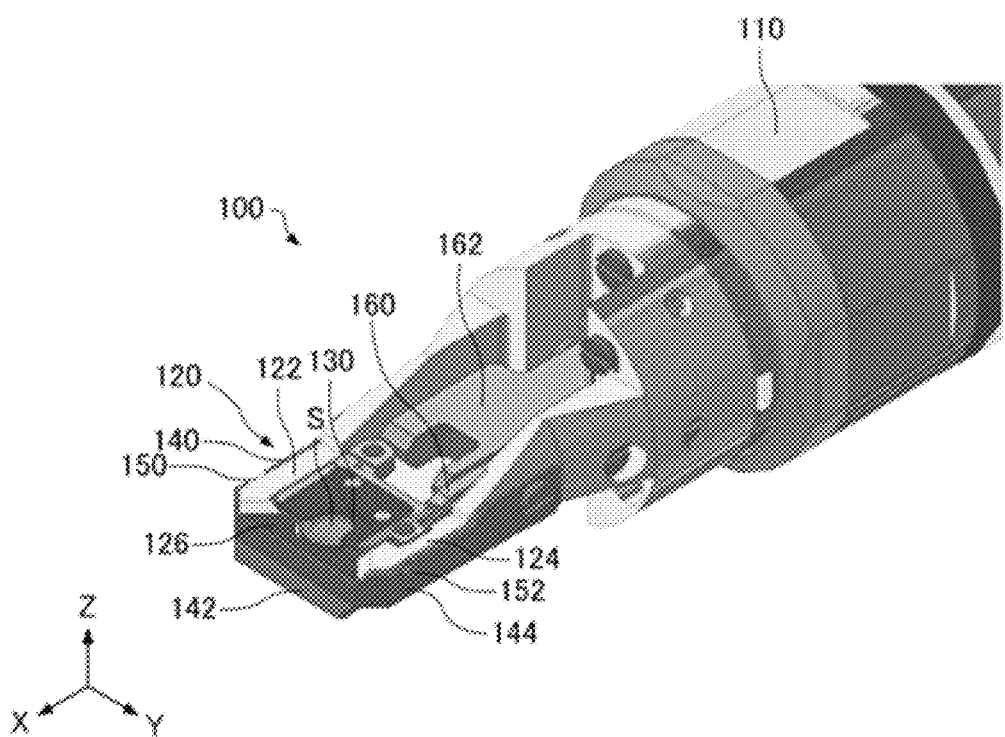
FIG. 2 is a schematic perspective view of the sample holder shown in FIG. 1.

FIG. 2 is a schematic perspective view of a front end portion of the sample holder 100. In FIG. 2, there are shown X-, Y-, and Z-axes as three mutually perpendicular axes.

The sample holder 100 is used to introduce the sample S into the sample chamber 2. The sample holder 100 includes a shaft portion 110, a frame 120, a sample stage 130, and a plurality of shield plates 140, 142, 144.

The shaft portion 110 is a rodlike member and movably mounted in a sample holder mounting hole 4 (see FIG. 1) while the inside of the sample chamber 2 is maintained airtight. In particular, a groove is formed circumferentially in the outer surface of the shaft portion 110 and an O-ring is mounted in this groove in a manner not illustrated. The O-ring is in contact with the inner surface of the sample holder mounting hole 4 and provides a hermetic seal between the shaft portion 110 and a holder mounting member. As the shaft portion 110 moves, the O-ring slides within the sample holder mounting hole 4. Consequently, the shaft portion 110 can be movably mounted in the sample holder mounting hole 4 while the inside of the sample chamber 2 is kept airtight. In the illustrated example, the shaft portion 110 has an axis extending along the X-axis.

In the electron microscope 1, the sample stage 130 (and thus the sample S) can be tilted by rotating the shaft portion 110 about its axis (parallel to the X-axis in the illustrated example) within the sample holder mounting hole 4.

The frame 120 is mounted on a front end of the shaft portion 110 so as to surround the sample stage 130 as viewed along the Z-axis. The frame 120 has a first portion 122, a second portion 124, and a third portion (also referred to as the bridge) 126.

The first portion 122 and second portion 124 of the frame 120 extend in the axial direction of the shaft portion 110 (in the direction of the X-axis). The first portion 122 is mounted on the negative Y side of the sample stage 130. The second portion 124 is mounted on the positive Y side of the sample stage 130. That is, the sample stage 130 is positioned between the first portion 122 and the second portion 124.

The third portion 126 of the frame 120 extends in the direction of the Y-axis and interconnects the front end of the first portion 122 on the positive side of the X-axis and the front end of the second portion 124 on the positive side of the X-axis. The third portion 126 is mounted on the positive X side of the sample stage 130 to offer mechanical strength to the frame 120.

The sample stage 130 is mounted to the frame 120. The sample stage 130 is a member for holding the sample S. The sample S is held on the sample stage 130. The sample stage 130 has a sample placement surface, for example, on which the sample S is placed. The sample S is held on the placement surface of the sample stage 130, for example, via a leaf spring (not shown).

The sample stage 130 and the frame 120 are connected together by shaft members 150 and 152. The shaft members 150 and 152 constitute a rotatable tilted shaft of the sample stage 130. The shaft member 150 extends from the first portion 122 of the frame 120 toward the sample stage 130. The shaft member 152 extends from the second portion 124 of the frame 120 toward the sample stage 130. Because the sample stage 130 is squeezed and held between the first shaft member 150 and the second shaft member 152, the sample stage 130 can be supported so as to be tiltable or rotatable about the shaft members 150 and 152.

An arm 160 is connected to the sample stage 130 and coupled to a lever 162. When the lever 162 rotates about its axis parallel to the Y-axis, the sample stage 130 connected to the lever 162 via the arm 160 rotates about the shaft members 150 and 152. The lever 162 is connected to a driving motor via a feed screw (not shown) mounted within the shaft portion 110. In the sample holder 100, the sample S held on the sample stage 130 can be tilted by operating the driving motor so as to tilt the sample stage 130 via the lever 162 and arm 160.

The shield plates 140, 142, and 144 are mounted to the first portion 122, third portion 126, and second portion 124, respectively, of the frame 120. The shield plates 140, 142, and 144 may be screwed to the frame 120 or adhesively or otherwise bonded thereto.

The shield plates 140, 142, and 144 may be detachably configured. Consequently, the material of the shield plates 140, 142, and 144 can be varied according to the material of the sample S under investigation. As such, it is possible, for example, to prevent spectral peaks arising from the shield plates 140, 142, and 144 from affecting (e.g., becoming superimposed on) the peaks of the elements of the sample S to be detected.

The shield plates 140, 142, and 144 may be formed as a unit or separately. There is no restriction on the material of the shield plates 140, 142, and 144 as long as they can shield X-rays. For example, the shield plates 140, 142, and 144 are made of a metal such as copper.

Figure 3:
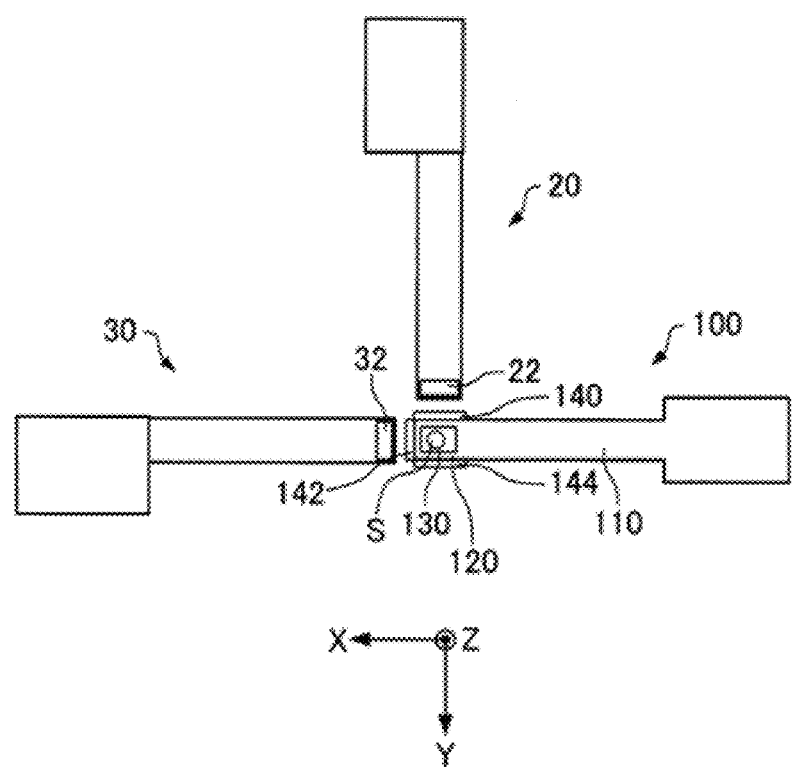
FIG. 3 is a view schematically illustrating the manner in which a sample stage of the sample holder shown in FIGS. 1 and 2 has been introduced into a sample chamber.
Figure 4:
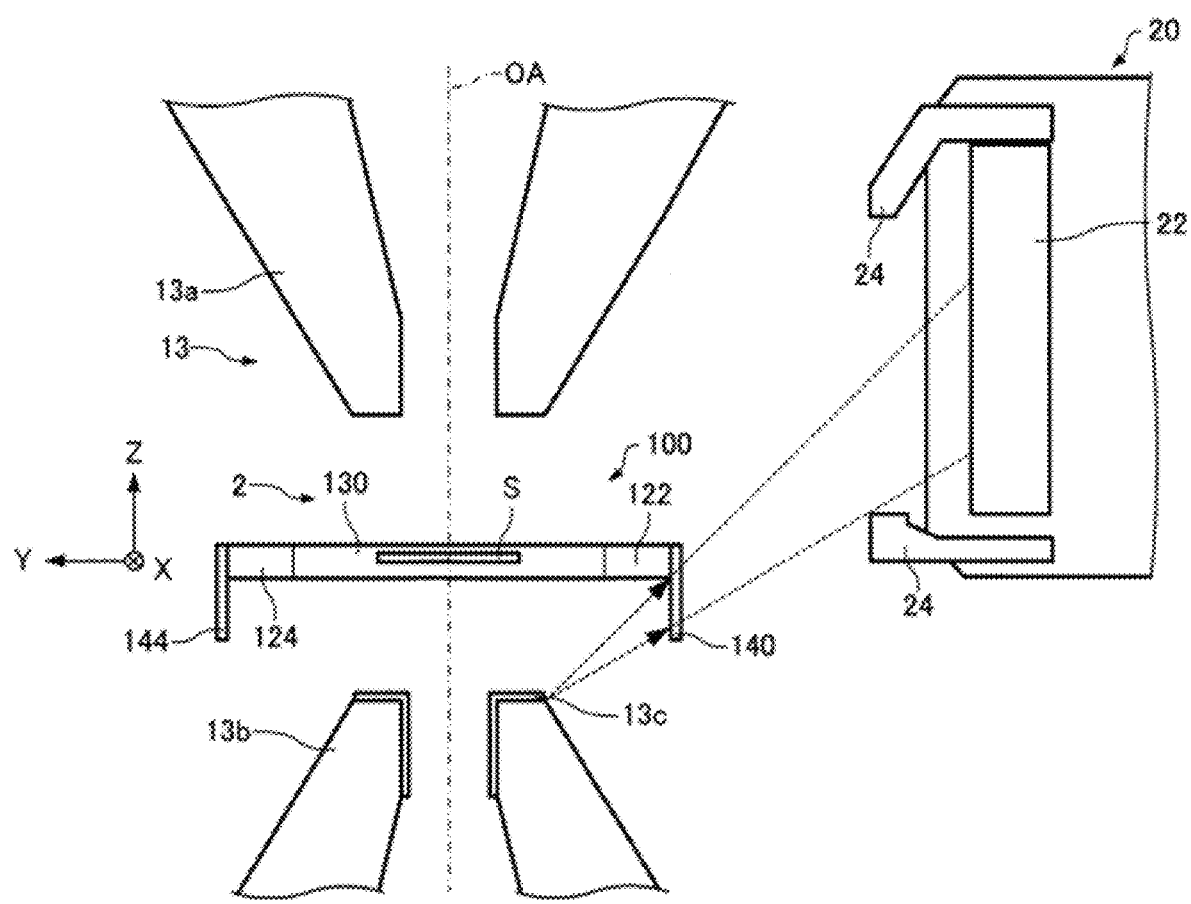
FIG. 4 is a schematic view illustrating a state in which the sample stage of the sample holder shown in FIGS. 1 and 2 has been introduced into the sample chamber.
Figure 5:
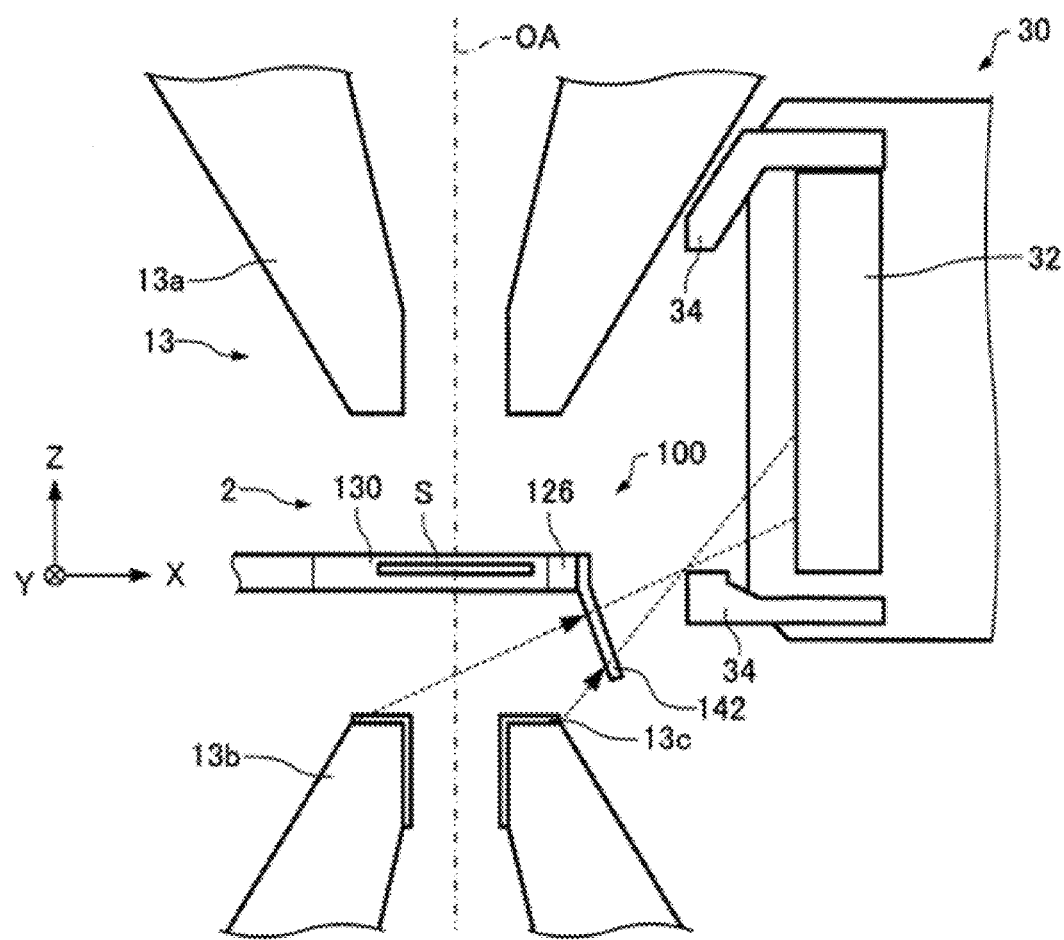
FIG. 5 is a schematic view illustrating a state in which the sample stage of the sample holder shown in FIGS. 1 and 2 has been introduced into the sample chamber.

FIGS. 3-5 are views schematically illustrating a state in which the sample stage 130 (i.e., the sample S) of the sample holder 100 has been introduced into the sample chamber 2. FIG. 3 is a view of the sample holder 100 and EDS spectrometers 20 and 30, as taken along the optical axis OA. FIGS. 4 and 5 are views of the sample holder 100 and EDS spectrometers 20 and 30, as taken perpendicularly to the optical axis OA. In FIG. 3, for the sake of convenience, members other than the sample holder 100 and EDS spectrometers 20 and 30 are omitted from being shown. In FIGS. 4 and 5, for the sake of convenience, members other than the sample holder 100, objective lens 13, and EDS spectrometers 20, 30 are omitted from being shown.

When the sample stage 130 has been introduced into the sample chamber 2 as shown in FIG. 3, the semiconductor detector 22 is located on the negative Y side of the sample S (sample stage 130), while the semiconductor detector 32 is positioned on the positive X side of the sample S (sample stage 130). That is, the semiconductor detector 22 is located in a direction running at right angles to the axial direction of the shaft portion 110 as viewed from the sample S (sample stage 130), and the semiconductor detector 32 is located in the axial direction of the shaft portion 110.

As shown in FIG. 4, a collimator 24 is disposed ahead of the semiconductor detector 22. Similarly, as shown in FIG. 5, another collimator 34 is disposed ahead of the semiconductor detector 32. The collimators 24 and 34 are provided to shield X-rays emanating from other than the sample S.

As shown in FIGS. 4 and 5, the objective lens 13 has a polepiece assembly including a top polepiece 13a and a bottom polepiece 13b. When the sample stage 130 is introduced into the sample chamber 2, the sample stage 130 is placed in the space between the top polepiece 13a and the bottom polepiece 13b. A cap 13c is mounted on the bottom polepiece 13b to suppress generation of X-rays from the bottom polepiece 13b. However, it is difficult to completely suppress the generation of X-rays by the cap 13c. X-rays may be released through a gap around the cap 13c.

When the sample stage 130 (sample S) has been introduced into the sample chamber 2 as shown in FIG. 4, the shield plate 140 is placed between the bottom polepiece 13b and the semiconductor detector 22. The shield plate 140 is placed in the path both of X-rays directed toward the semiconductor detector 22 after being reflected by the bottom polepiece 13b and of X-rays directed toward the semiconductor detector 22 after being generated from the bottom polepiece 13b. For example, the shield plate 140 is so positioned that the bottom polepiece 13b is hidden as viewed from the sensitive surface of the semiconductor detector 22.

The shield plate 140 protrudes toward the bottom polepiece (13b) side from the first portion 122 of the frame 120. The shield plate 140 protrudes from the frame 120 along or parallel to the optical OA of the objective lens 13 when the sample stage 130 is not tilted about the X-axis. In the illustrated example, the shield plate 140 protrudes from the frame 120 along the Z-axis. The shield plate 140 is mounted to the frame 120 perpendicularly to the placement surface of the sample stage 130 that is at right angles to the optical axis OA, for example, when the sample stage 130 is not tilted. The length of the shield plate 140 in the direction of protrusion is greater than the thickness of the frame 120, i.e., dimension taken along the Z-axis.

When the sample stage 130 (sample S) is introduced into the sample chamber 2 as shown in FIG. 5, the shield plate 142 is positioned between the bottom polepiece 13b and the semiconductor detector 32. The shield plate 142 is placed in the path both of X-rays traveling toward the semiconductor detector 32 after being reflected by the bottom polepiece 13b and of X-rays traveling toward the semiconductor detector 32 after being generated from the bottom polepiece 13b. For example, the shield plate 142 is disposed such that the bottom polepiece 13b is hidden as viewed from the sensitive surface of the semiconductor detector 32.

The shield plate 142 protrudes from the third portion 126 of the frame 120 toward the bottom polepiece (13b) side at an angle to and away from the optical axis OA of the objective lens 13. In the illustrated example, the shield plate 142 protrudes from the frame 120 at an angle to the Z-axis. The shield plate 142 is mounted to the frame 120 at an angle to the placement surface of the sample stage 130 that is perpendicular to the optical axis OA, for example, when the sample stage 130 is not tilted. The length of the shield plate 142 in the direction of projection is greater than the thickness of the frame 120, i.e., the dimension in the direction of the Z-axis.

When an electron beam hits the sample S held on the sample stage 130, X-rays are generated from below the sample S by the Bremsstrahlung effect. That is, electrons undergo acceleration from the electric fields in atomic nuclei within the sample and emit electromagnetic waves (X-rays). If the Bremsstrahlung X-rays are reflected by the bottom polepiece 13b and directed toward the semiconductor detector 22, the X-rays are shielded by the shield plate 140. Similarly, if the Bremsstrahlung X-rays are reflected by the bottom polepiece 13b and directed toward the semiconductor detector 32, the X-rays are shielded by the shield plate 142.

When an electron beam is made to hit the sample S, electrons are scattered within the sample S, thus producing scattered electrons. The scattered electrons collide against the bottom polepiece 13b, generating characteristic X-rays therefrom. The X-rays generated from the bottom polepiece 13b and directed toward the semiconductor detector 22 are blocked by the shield plate 140. Similarly, the X-rays generated from the bottom polepiece 13b and directed toward the semiconductor detector 32 are blocked by the shield plate 142.

In this way, the shield plates 140 and 142 block out unwanted X-rays which would become a background source of the spectrum. Thus, unwanted X-rays accepted into the semiconductor detectors 22 and 32 can be restricted.

In the foregoing case, the shield plate 140 protrudes along the optical axis OA. The shield plate 140 may protrude at an angle to the optical axis OA. Furthermore, in the foregoing case, the shield plate 142 protrudes at an angle to the optical axis OA. The shield plate 142 may protrude along the optical axis OA.

The sample holder 100 associated with the present embodiment has the following features. The sample holder 100 includes the shield plate 140 which is located between the polepiece assembly and the semiconductor detector 22 when the sample stage 130 has been introduced into the sample chamber 2 of the electron microscope 1. Therefore, unwanted X-rays accepted into the semiconductor detector 22 can be restricted.

In the sample holder 100, the shield plate 140 is located between the bottom polepiece 13b and the semiconductor detector 22 when the sample stage 130 has been introduced into the sample chamber 2. Therefore, the shield plate 140 can shield X-rays produced by the effect of Bremsstrahlung and reflected by the bottom polepiece 13b and X-rays generated by collision of scattered electrons against the bottom polepiece 13b. Consequently, unwanted X-rays accepted into the semiconductor detector 22 can be limited.

In the sample holder 100, the shield plate 140 is mounted to the frame 120 and protrudes thence toward the bottom polepiece (13b) side. Therefore, the shield plate 140 can shield X-rays produced by the effect of Bremsstrahlung and reflected by the bottom polepiece 13b and X-rays produced by collision of scattered electrons against the bottom polepiece 13b. In consequence, unwanted X-rays accepted into the semiconductor detector 22 can be limited.

The electron microscope 1 has the two semiconductor detectors 22 and 32. The sample holder 100 has the two shield plates 140 and 142 corresponding to the two semiconductor detectors 22 and 32, respectively. When the sample stage 130 is introduced into the sample chamber 2, the shield plate 140 is placed between one semiconductor detector 22 out of the two semiconductor detectors and the bottom polepiece 13b, while the shield plate 142 is positioned between the other semiconductor detector 32 out of the two semiconductor detectors and the bottom polepiece 13b. Consequently, if the electron microscope 1 has the two semiconductor detectors, the sample holder 100 can restrict unwanted X-rays accepted into the semiconductor detectors.

In the sample holder 100, when the sample stage 130 is introduced into the sample chamber 2, the shield plate 140 protrudes along the optical axis OA of the objective lens 13. Therefore, the shield plate 140 can be easily formed, and the sample holder 100 is easy to fabricate.

In the sample holder 100, when the sample stage 130 is introduced into the sample chamber 2, the shield plate 142 protrudes at an angle to the optical axis OA of the objective lens 13. For example, if the shield plate is prolonged to shield X-rays, the shield plate may collide with the bottom polepiece 13b. Because the shield plate 142 protrudes at an angle to the optical axis OA, if the shield plate 142 is lengthened, collision of the shield plate 142 with the bottom polepiece 13b can be better prevented than where the shield plate 142 protrudes along the optical axis OA.

Since the electron microscope 1 includes the sample holder 100, unwanted X-rays accepted into the semiconductor detectors can be restricted. Accordingly, in the electron microscope 1, the background of the spectrum can be reduced without major modifications to the instrument.

Figure 6:
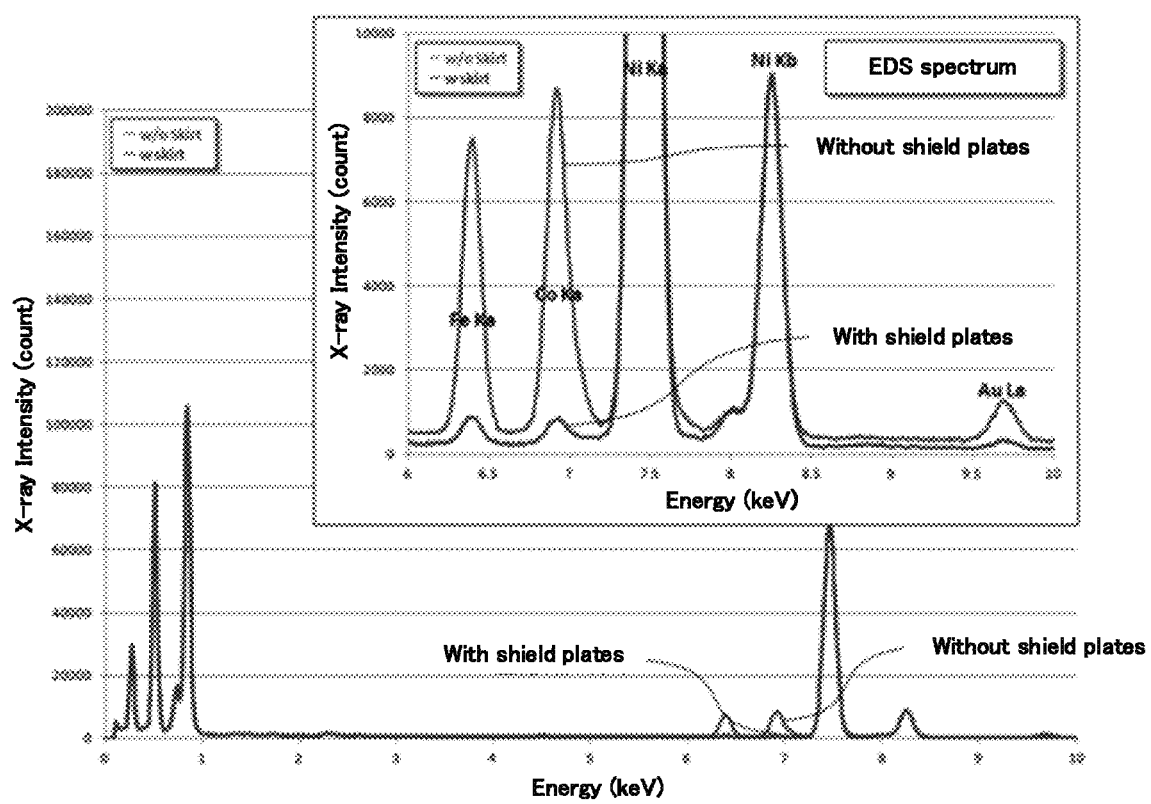
FIG. 6 is a diagram in which an EDS spectrum obtained using a sample holder having shield plates and an EDS spectrum obtained using a sample holder having no shield plates are compared.

FIG. 6 compares an EDS spectrum (with shield plates) obtained by the use of the sample holder 100 having the shield plates 140, 142, and 144 and an EDS spectrum (without shield plates) obtained by the use of a sample holder having no shield plates. The sample holder having no shield plates is similar in configuration to the sample holder 100 except that the shield plates 140, 142, and 144 are not formed.

As can be seen from FIG. 6, the peaks arising from Fe and Co that are elements included in the polepieces have been reduced greatly by forming the shield plates 140, 142, and 144. Consequently, it can be seen that unwanted X-rays accepted into the semiconductor detectors can be limited by providing the shield plates 140, 142, and 144.

2. Second Embodiment

Figure 7:
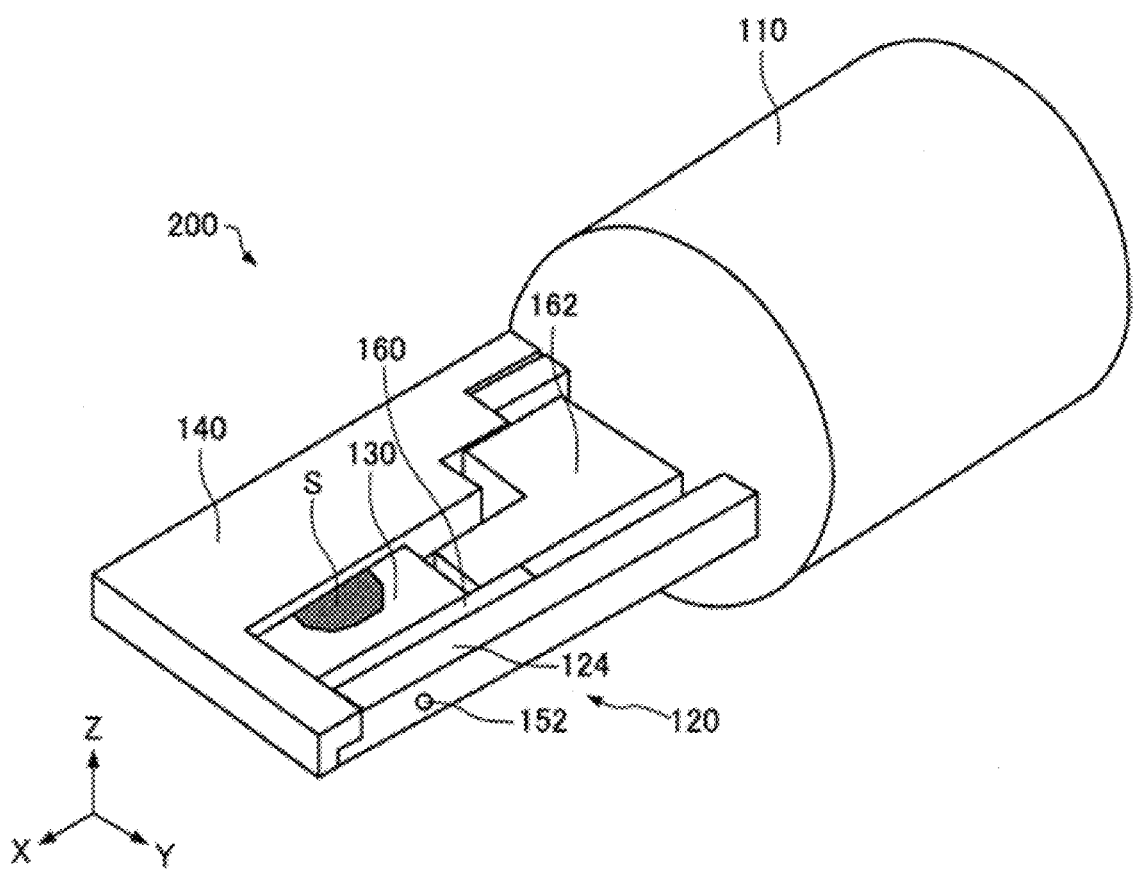
FIGS. 7 and 8 are schematic perspective views of a sample holder associated with a second embodiment, showing different states of operation.
Figure 8:
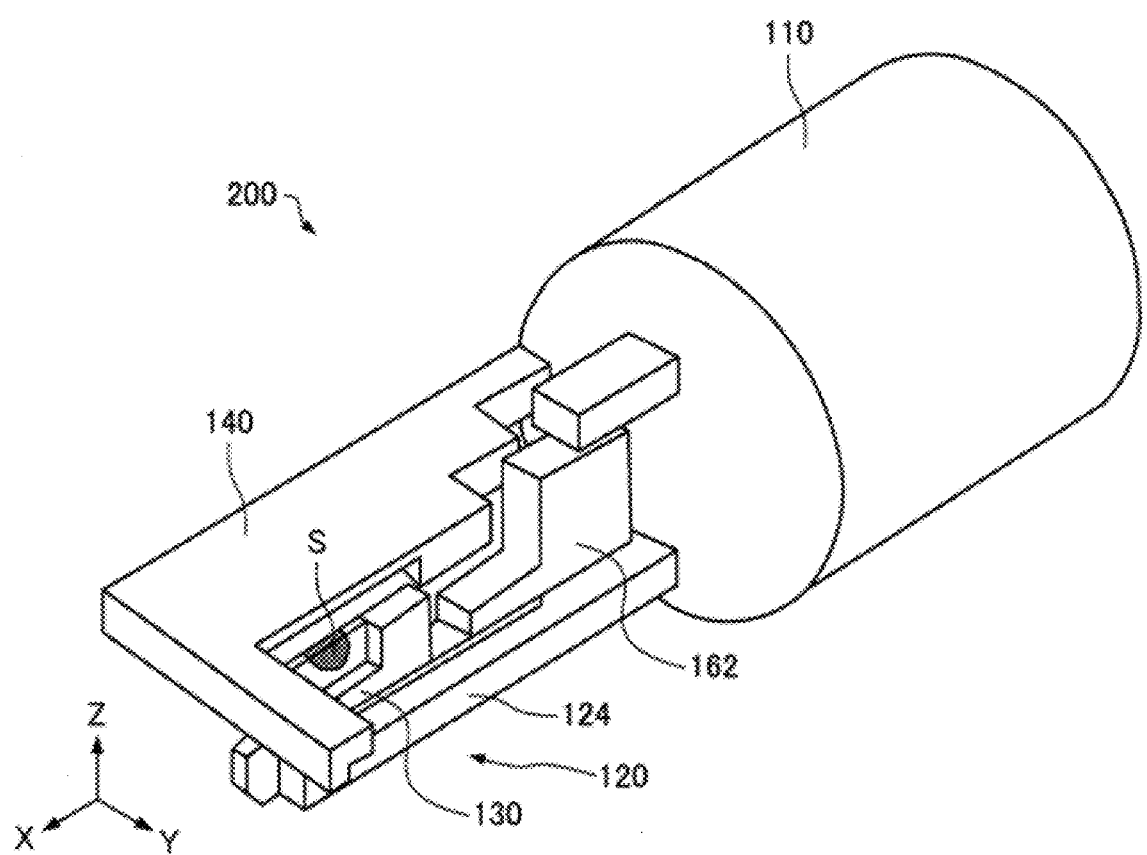

A sample holder 200 associated with a second embodiment is next described by referring to FIGS. 7 and 8, which are schematic perspective views of the sample holder 200. Those members of the sample holder 200 which are similar in function to their respective counterparts of the sample holder 100 associated with the first embodiment are indicated by the same reference numerals as in the above cited figures and a detailed description thereof is omitted. In FIGS. 7 and 8, various members of the sample holder are shown in simplified form.

The sample holder 200 is different from the above-described sample holder 100 in that the frame 120 is configured rotatably about the axis of the shaft portion 110 independently of the shield plate 140 as shown in FIGS. 7 and 8. The sample holder 200 can be used for both an electron microscope and a focused ion beam (FIB) system.

FIG. 7 shows a state in which the sample holder 200 is used as a sample holder of the electron microscope 1. FIG. 8 shows a state in which the sample holder 200 is used as a sample holder of the focused ion beam system. The focused ion beam system is equipment for processing the sample S by irradiating the sample S with a focused ion beam and sputtering the sample S by the beam.

In the sample holder 200, the sample stage 130 is supported on one side by the frame 120. The frame 120 has only the second portion 124 and does not have the first portion 122 and third portion 126 (see FIG. 2). That is, the side of the sample stage 130 opposite to its side supported by the frame 120 is open. The second portion 124 of the frame 120 and the sample stage 130 are connected together by the shaft member 152. That is, the sample stage 130 is cantilevered by the second portion 124 of the frame 120.

The side of the sample stage 130 opposite to its side supported by the frame 120 is cut out in conformity with the shape of a sample support mesh that is a cut-out mesh or semicircular mesh used in the focused ion beam system. The sample stage 130 rotates concomitantly with rotation of the frame 120.

In the sample holder 200, the sample stage 130 can be moved between a first position where the shield plate 140 is located on the side of the sample stage 130 opposite to its side supported by the second portion 124 of the frame 120 as shown in FIG. 7 and a second position where the sample S held on the sample stage 130 can be irradiated with the focused ion beam from the opposite side where the sample stage 130 is supported by the second portion 124 of the frame 120 as shown in FIG. 8, by rotating the frame 120 about the axis of the shaft portion 110.

The shield plate 140 is coupled to the shaft portion 110 and so if the frame 120 rotates, the shield plate 140 does not rotate.

In FIG. 7, the shield plate 140 is located on the side (i.e., on the negative side of the Y-axis) of the sample stage 130 opposite to its side supported by the frame 120. The shield plate 140 is located in the cut-out portion of the sample stage 130 on the side opposite to its side supported by the frame 120 and in the open portions of the frame 120 where neither the first portion 122 nor the third portion 126 is formed.

In FIG. 8, the sample stage 130 is angularly shifted by an angle of 90 degrees from the position shown in FIG. 7 about the axis of the shaft portion 110. The position of the shield plate 140 is not different from the position shown in FIG. 7.

Figure 9:
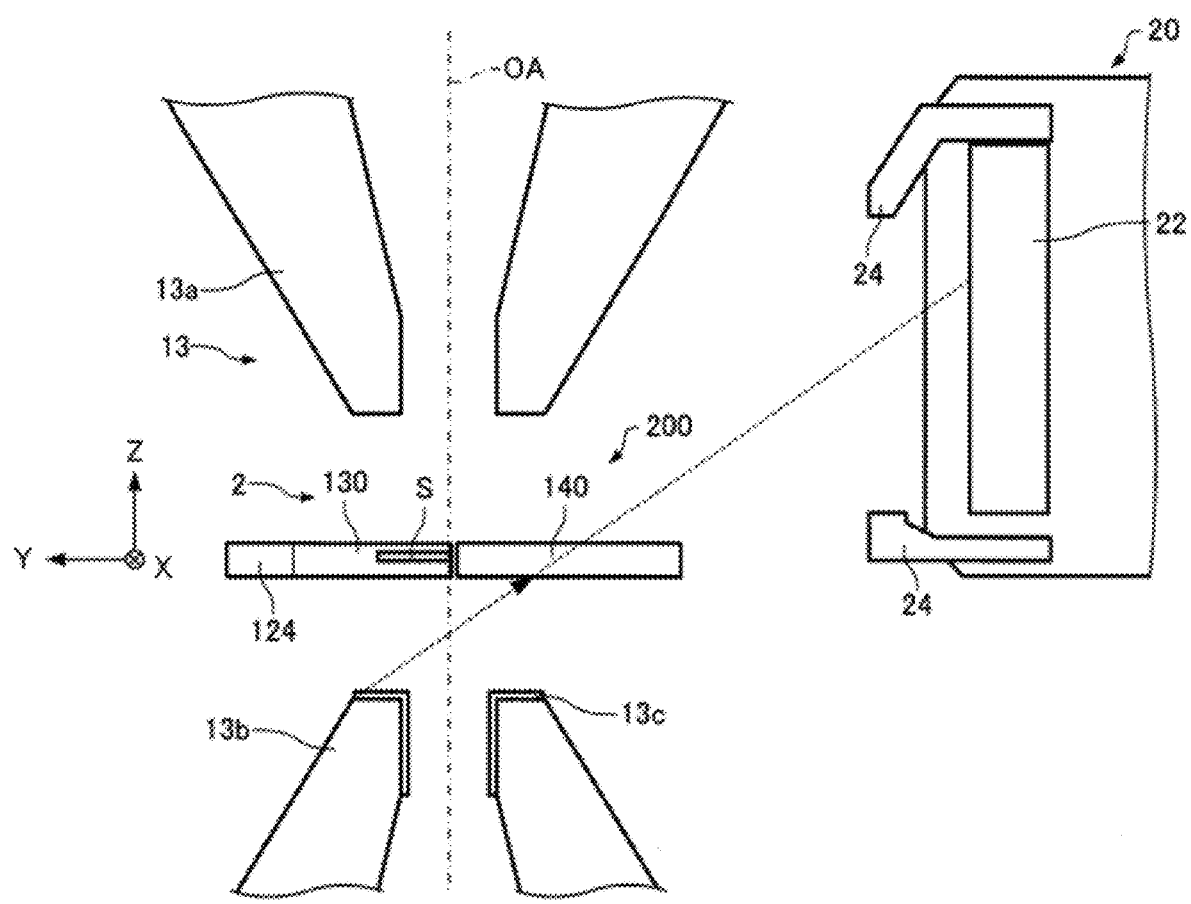
FIG. 9 is a schematic view showing a state in which a sample stage of the sample holder shown in FIGS. 7 and 8 has been introduced in a sample chamber.

FIG. 9 is a schematic diagram illustrating the manner in which the sample stage 130 (sample S) of the sample holder 200 has been inserted in the sample chamber 2. In FIG. 9, for the sake of convenience, members other than the sample holder 100, objective lens 13, and EDS spectrometers 20, 30 are omitted from being shown. In FIG. 9, the sample stage 130 is located in the first position shown in FIG. 7.

As shown in FIG. 9, the shield plate 140 is located closer to the semiconductor detector 22 than is the sample stage 130 and between the bottom polepiece 13b and the semiconductor detector 22. The shield plate 140 can shield X-rays produced by the Bremsstrahlung effect and reflected by the bottom polepiece 13b and X-rays produced by collision of scattered electrons against the bottom polepiece 13b.

Figure 10:
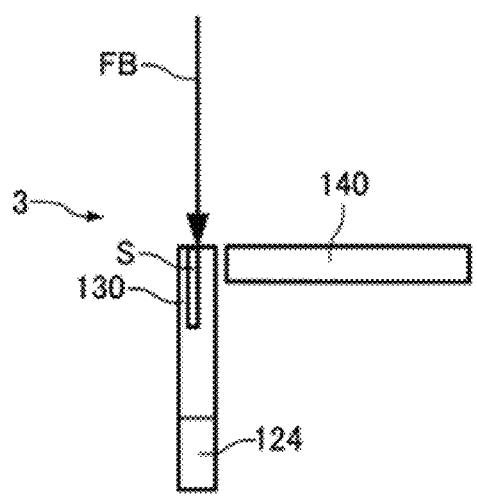
FIG. 10 is a schematic view showing a state in which the sample stage of the sample holder shown in FIGS. 7 and 8 has been introduced into the sample chamber of a focused ion beam system.

FIG. 10 is a schematic diagram illustrating a state in which the sample stage 130 of the sample holder 200 has been introduced in the sample chamber 3 of the focused ion beam system. In FIG. 10, for the sake of convenience, members other than the sample holder 200 are omitted from being shown. In FIG. 10, the sample stage 130 is located at the second position shown in FIG. 8.

As shown in FIGS. 8 and 10, one side of the sample stage 130 is supported by the frame 120, while its opposite side is open. Therefore, the focused ion beam FB can be made to impinge on the sample S held on the sample stage 130 from the side of the sample stage 130 opposite to its side supported by the second portion 124 of the frame 120. Furthermore, the shield plate 140 does not block the focused ion beam FB directed at the sample S because the frame 120 can be rotated about the axis of the shaft portion 110 independently of the shield plate 140.

The sample holder 200 has the following features. In the sample holder 200, the frame 120 is configured so as to be rotatable about the axis of the shaft portion 110 independently of the shield plate 140. The sample stage 130 can be moved between the first position where the shield plate 140 is located on the side of the sample stage 130 opposite to its side supported by the frame 120 and the second position where the focused ion beam can be directed at the sample S held on the sample stage 130 from the side of the sample stage 130 opposite to its side supported by the frame 120, by rotating the frame 120 about the axis of the shaft portion 110. Therefore, where the sample holder 200 is used as a sample holder for the electron microscope 1, unwanted X-rays accepted into the semiconductor detector 22 can be limited by the shield plate 140. Where the sample holder 200 is used as a sample holder for the focused ion beam system, the shield plate 140 does not block the focused ion beam FB directed at the sample S.

Figure 11:
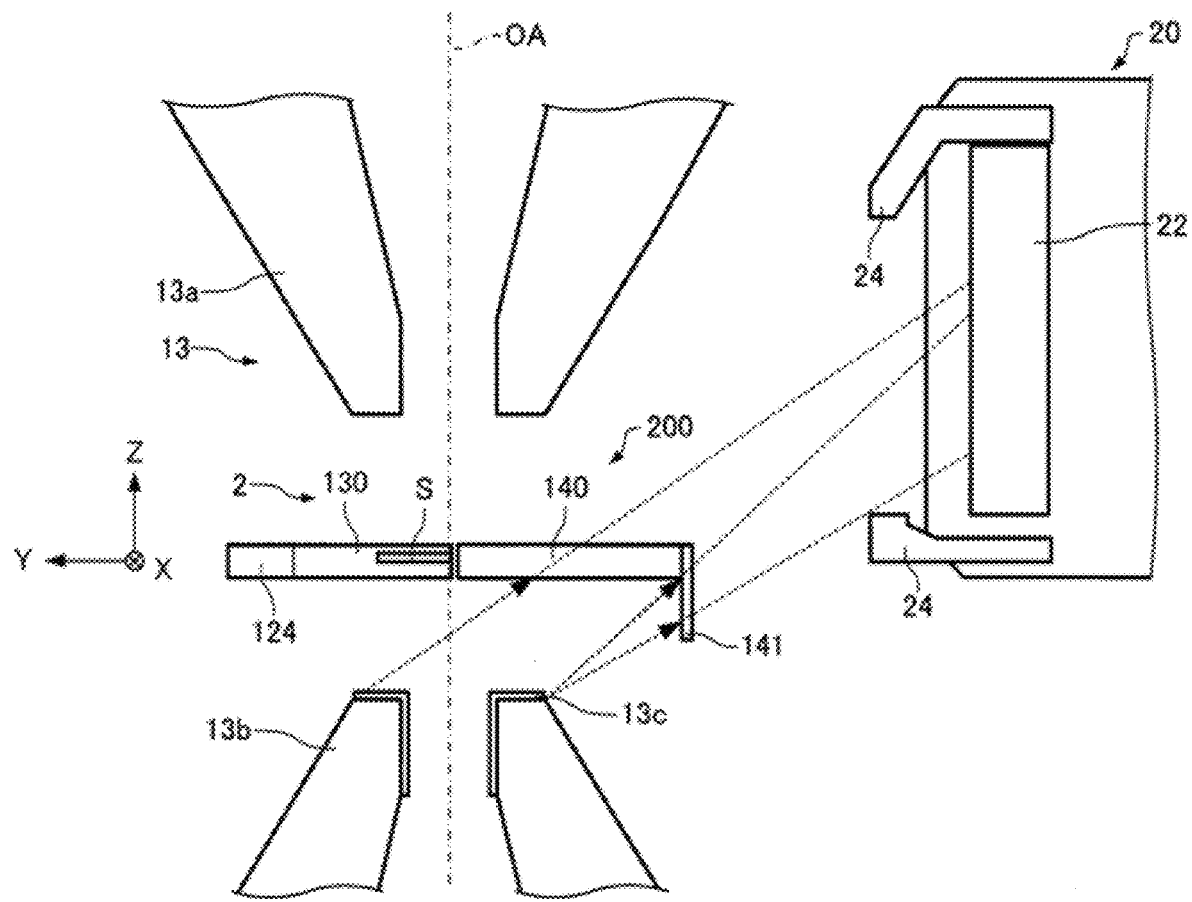
FIG. 11 is a schematic view of a sample holder associated with a modification of the second embodiment.

In the sample holder 200, in a case where the sample stage 130 is introduced into the sample chamber 2 as shown in FIG. 11, the shield plate 140 may have a protrusive portion 141 extending toward the bottom polepiece 13b. In this case, the shield plate 140 can restrict unwanted X-rays accepted into the semiconductor detector 22. In the example shown in FIG. 10, the protrusive portion 141 extends along the optical axis OA. Alternatively, the protrusive portion 141 may extend obliquely relative to the optical axis OA.

It is to be understood that the present invention is not restricted by the above-described embodiments and that the invention can be implemented in variously modified forms without departing from the gist of the invention.

For example, in the description of the above-described first embodiment, the sample holder 100 is a sample holder for use in or with a transmission electron microscope (TEM). The sample holder 100 may be a sample holder adapted for use in or with a scanning transmission electron microscope (STEM) or in or with a scanning electron microscope (SEM). Furthermore, in the above-described second embodiment, the sample holder 200 can be used for both a transmission electron microscope (TEM) and a focused ion beam (FIB) system. Alternatively, the sample holder 200 may be used for both a scanning transmission electron microscope (STEM) and a focused ion beam (FIB) system or used for both a scanning electron microscope (SEM) and a focused ion beam (FIB) system.

Further, in the above-described first embodiment, the electron microscope 1 has the two semiconductor detectors 22 and 32, and the sample holder 100 has the plurality of shield plates 140, 142, and 144. As an example, where the electron microscope has only one semiconductor detector, the sample holder 100 may have only one shield plate.

Figure 12:
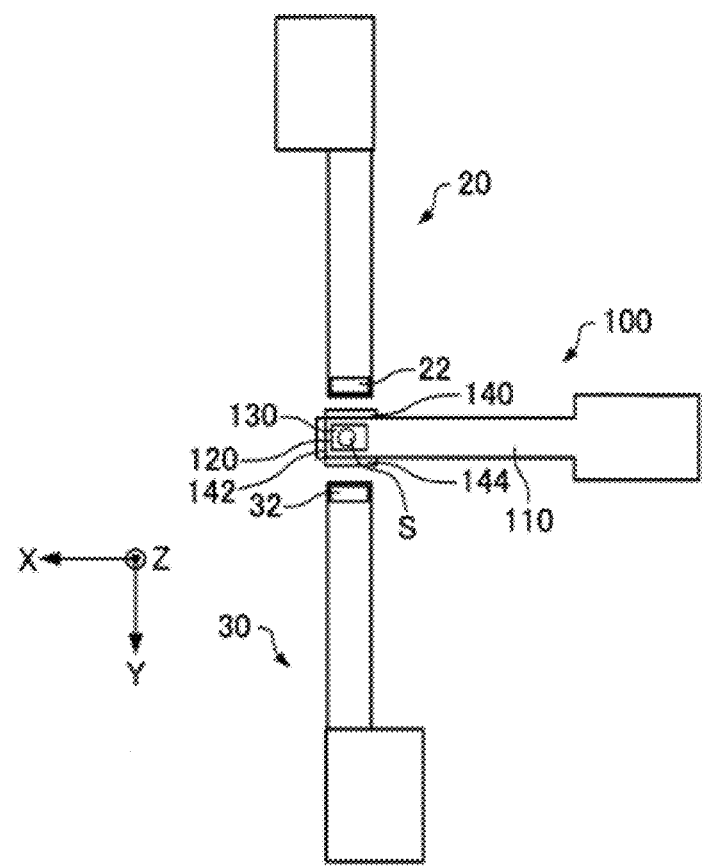
FIG. 12 is a view showing one arrangement of a semiconductor detector.
Figure 13:
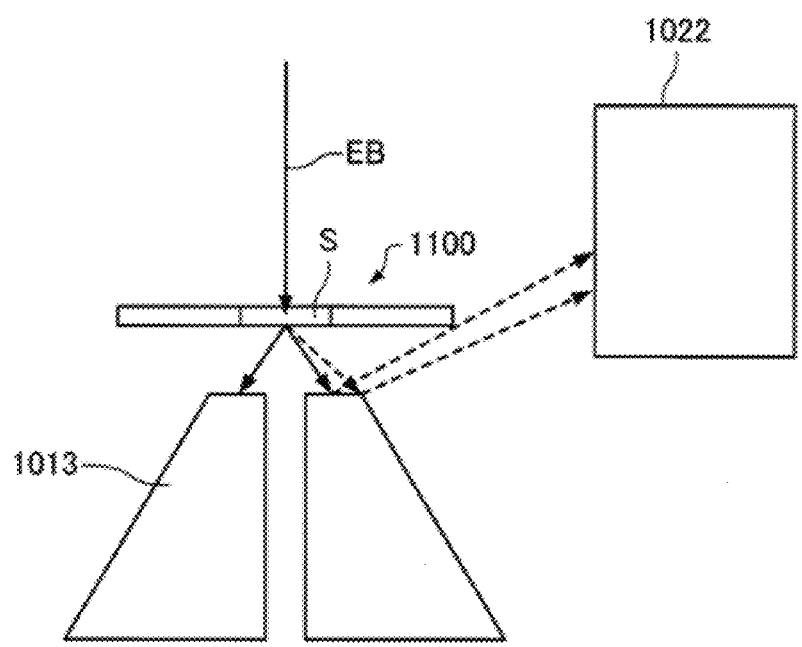
FIG. 13 is a schematic view showing the manner in which an EDS analysis is being carried out with a transmission electron microscope.

Additionally, in the above-described first embodiment, when the sample stage 130 has been introduced in the sample chamber 2, the semiconductor detector 22 is located on the negative Y side of the sample S (sample stage 130), while the semiconductor detector 32 is positioned on the positive X side of the sample S (sample stage 130) as shown in FIG. 3. The positions of the semiconductor detectors 22 and 32 are not restricted to this example. For example, as shown in FIG. 12, when the sample stage 130 has been introduced in the sample chamber 2, the semiconductor detector 22 may be located on the negative Y side of the sample S (sample stage 130) and the semiconductor detector 32 may be located on the positive Y side of the sample S (sample stage 130). In this case, the shield plate 140 is located between the bottom polepiece 13b and the semiconductor detector 22, and the shield plate 144 is situated between the bottom polepiece 13b and the semiconductor detector 32.

It is to be noted that the above embodiments and modifications are merely exemplary and that the present invention are not restricted thereto. For example, the embodiments and modifications may be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced.

Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

What is claimed is:

1. A sample holder for use in or with an electron microscope having an objective lens and at least one X-ray detector, the objective lens including a polepiece assembly, said sample holder comprising:
 a sample stage on which a sample is held;
 a shield plate which is placed between the polepiece assembly and the X-ray detector when the sample stage has been introduced in a sample chamber of the electron microscope; and
 a shaft portion and a frame mounted on a front end of the shaft portion, and wherein said sample stage is mounted to the frame,
 wherein said polepiece assembly has a top polepiece and a bottom polepiece,
 said sample stage is inserted between the top polepiece and the bottom polepiece, and
 said shield plate is located between the bottom polepiece and said X-ray detector when the sample stage has been introduced in said sample chamber, and
 wherein said shield plate is mounted to said frame, and wherein the shield plate protrudes from the frame toward a side of said bottom polepiece when said sample stage has been introduced in said sample chamber.

2. The sample holder as set forth in claim 1, wherein when said sample stage has been introduced in said sample chamber, said shield plate protrudes along an optical axis of said objective lens.

3. The sample holder as set forth in claim 1, wherein when said sample stage has been introduced in said sample chamber, said shield plate protrudes at an angle to an optical axis of said objective lens.

4. The sample holder as set forth in claim 1, wherein said shield plate is configured to be detachable.

5. The sample holder as set forth in claim 1, wherein said at least one X-ray detector of said electron microscope is two in number, and wherein when said sample stage has been introduced in said sample chamber, said shield plate is disposed between one of the two X-ray detectors and said polepiece assembly and between the other of the two X-ray detectors and the polepiece assembly.

6. An electron microscope including the sample holder as set forth in claim 1.

* * * * *